United States Patent [19]

Asazawa

[11] Patent Number: 4,810,909

[45] Date of Patent: Mar. 7, 1989

[54] AMPLIFIER CIRCUIT HAVING HIGH-SPEED RAISING TIME

[75] Inventor: Hiroshi Asazawa, Tokyo, Japan

[73] Assignee: Nec Corporation, Japan

[21] Appl. No.: 942,191

[22] Filed: Dec. 16, 1986

[30] Foreign Application Priority Data

Dec. 20, 1985 [JP] Japan .................. 60-287150

[51] Int. Cl.4 .............. H03K 17/16; H03K 5/13
[52] U.S. Cl. .................. 307/491; 307/592;
307/443; 307/272.1; 330/9
[58] Field of Search ............ 307/491, 490, 200 A,
307/200 B, 443, 592, 445, 352, 353; 330/9, 290,
291, 296, 259, 270, 297, 86, 96, 97

[56] References Cited

U.S. PATENT DOCUMENTS

| | | | |
|---|---|---|---|
| 3,955,105 | 5/1976 | Defendorf | 307/240 |
| 4,297,642 | 10/1981 | Baldwin et al. | 330/9 |
| 4,322,687 | 3/1982 | Dwarakanath et al. | 330/259 |
| 4,430,622 | 2/1984 | Simoes | 307/491 |
| 4,553,052 | 11/1985 | Takahashi | 307/491 |
| 4,560,890 | 12/1985 | Masuda et al. | 307/352 |

OTHER PUBLICATIONS

Mullally, "Analog Tuning Circuit with Multiplexing", IBM Tech Dis. Bulletin, vol. 20, No. 9, Feb. 78, pp. 3416-3418.

Primary Examiner—Stanley D. Miller
Assistant Examiner—Timothy P. Callahan
Attorney, Agent, or Firm—Laff, Whitesel, Conte & Saret

[57] ABSTRACT

A capacitor coupling usually delays response, especially during intermittent energization that provides a battery saving feature. The invention provides a feedback which retains charges stored on the capacitor during battery saving power off intervals and which gives an almost instantaneous response when power returns. An electronic switch in the feedback path controls the charge retention.

13 Claims, 3 Drawing Sheets

AMPLIFIER CIRCUIT HAVING HIGH-SPEED RAISING TIME

BACKGROUND OF THE INVENTION

The present invention relates to an amplifier circuit and, more particularly, to an amplifier circuit of the type having a capacitor which is inserted on the input side of the circuit in order to adjust the direct current (DC) operating point in relation to preceding circuitry.

If an amplifier circuit is preceded by an external circuit, a capacitor is usually installed in the amplifier circuit so as to adjust the DC operating points of the external circuit and of the amplifier circuit. A bias voltage to be applied to such an amplifier circuit may be set up by any of two different approaches as well known in the art, i.e., feeding back the output of the amplifier circuit via a resistor, and dividing the power source voltage by the resistor. A problem with a circuit adapted to set up a bias voltage as described is that when a power source of the external circuit is operated intermittently to provide a battery saving feature, the enabling of the amplifier circuit is delayed by a certain time constant which is determined by the bias setting resistor and by the capacitor on the input side.

The delay in the enabling of the amplifier circuit often becomes a serious problem from the system standpoint. For example, when an amplifier circuit with any of the bias setting arrangements as described above is installed in a phase locked loop (PLL) which is operated in an intermittent or battery-saving mode, the so-called lock-in time becomes impractically long.

SUMMARY OF THE INVENTION

It is therefore an object of the present invention to provide an amplifier circuit which is connected to an external circuit via a capacitor and which is capable of being enabled without any delay even when an external circuit is operated intermittently.

It is another object of the present invention to provide an amplifier circuit having a short build-up time which is desirable in relation to a PLL.

In accordance with the present invention, an amplifier circuit comprises capacitor means connected at one end thereof to the output of an external circuit, amplifier means connected at the input thereof to the other end of the capacitor means, resistor means connected between the input and the output of the amplifier means, and switch means. The switch means is interlocked to the to ONs and OFFs of a power source which is associated with the external circuit.

BRIEF DESCRIPTION OF THE DRAWINGS

The above and other objects, features and advantages of the present invention will become more apparent from the following detailed description taken in conjunction with the accompanying drawings, in which.

DETAILED DESCRIPTION OF THE EMBODIMENTS

Figure 5A:
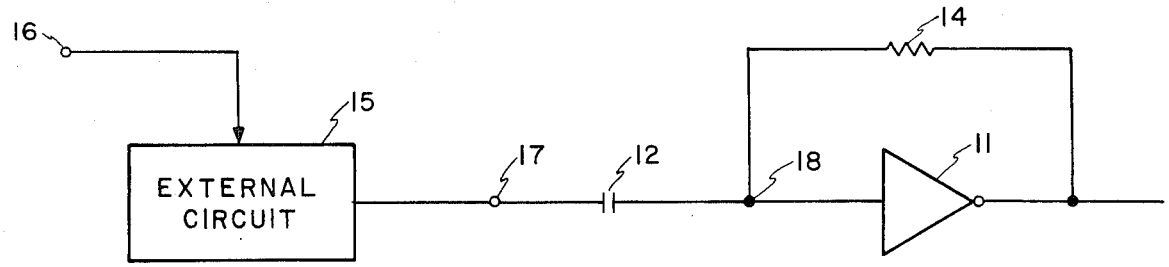
FIGS. 5A to 5D are schematic diagrams, each showing a prior art amplifier circuit.
Figure 5B:
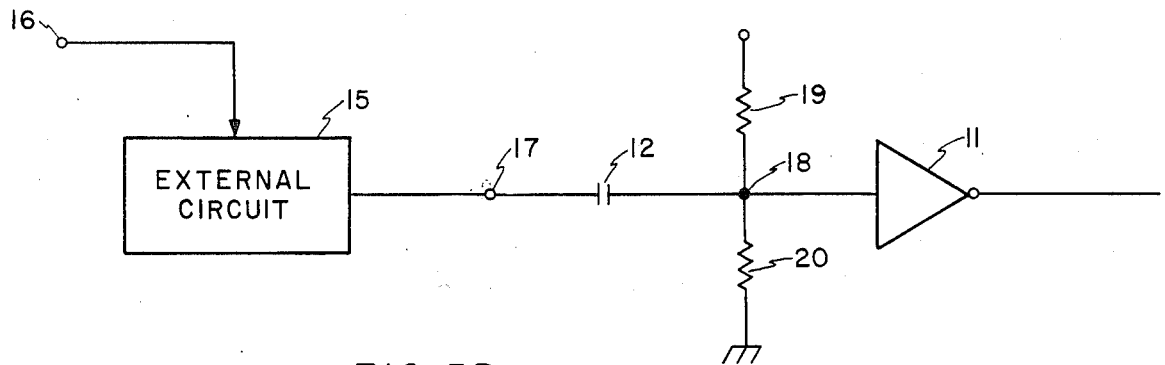
Figure 5C:
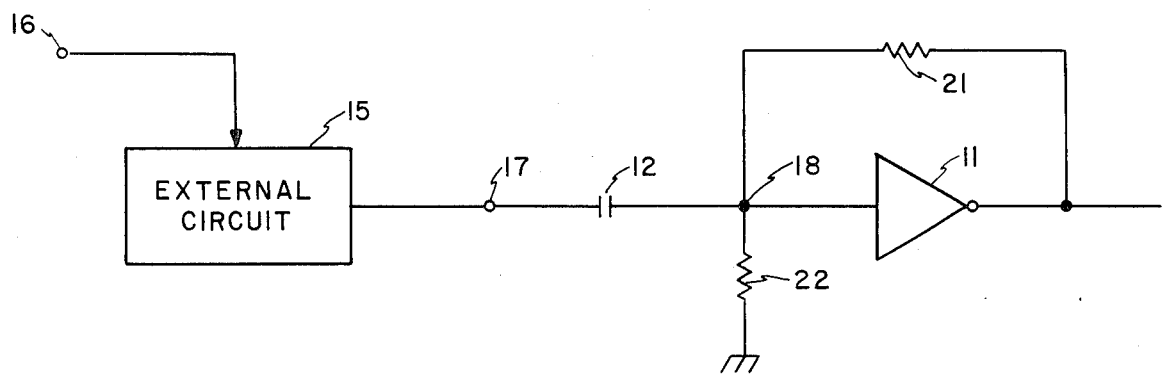
Figure 5D:
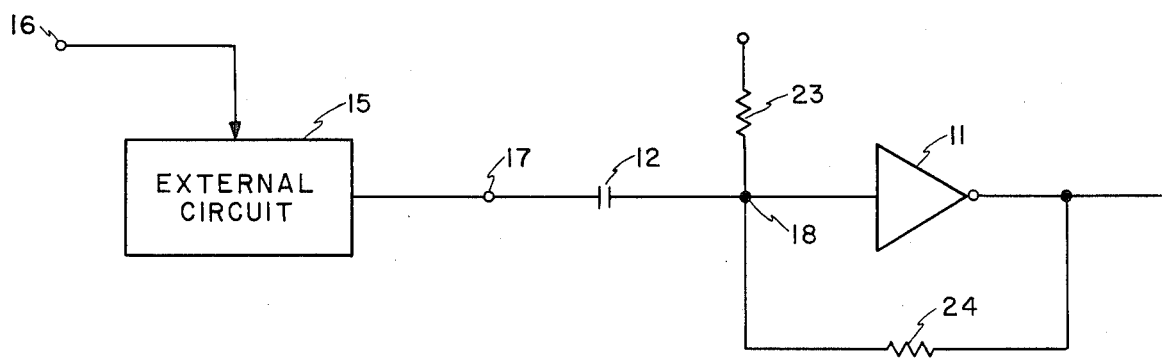

To better understand the present invention, a brief reference will be made to some prior art amplifier circuits, shown in FIGS. 5A to 5D. The amplifier circuits of FIGS. 5A to 5D are common to each other in that an input of an inverting amplifier 11 is connected to an output terminal 17 of an external circuit 15 via a capacitor 12. A power source of the external circuit 15 is controlled by a control signal which is applied thereto via a control terminal 16. In FIG. 5A, an input terminal 18 and an output terminal of the amplifier 11 are connected to each other via a resistor 14 to complete a feedback circuit, whereby a bias for the amplifier 11 is set up. In FIG. 5B, resistors 19 and 20 are interposed between a power source and ground. The input terminal 18 of the amplifier 11 is connected to the junction of the resistors 19 and 20, whereby a bias for the amplifier 11 is set up. In FIG. 5C, the bias setting scheme is substantially the same as that of FIG. 5B except that resistors 21 and 22 are inserted between the output terminal of the amplifier 11 and ground. Further, the bias setting scheme of FIG. 5D is similar to those of FIGS. 5B and 5C except that resistors 23 and 24 are connected between the output of the amplifier 11 and a power source.

All of the bias setting schemes in the amplifier circuits, as shown in FIGS. 5A to 5D, contemplate a maintenance of a constant input bias by means of a resistor or resistors and, therefore, has a problem as will be described with reference to FIG. 5A. Let it be assumed that the external circuit 15 is intermittently energized in response to a control signal provided via the control terminal 16. Upon transition of the power source from an ON state to an OFF state, the output terminal 17 of the external circuit 15 becomes a zero potential (or possibly to another potential) resulting with the capacitor 12 being charged to a voltage which appears on the input terminal 18 of the amplifier 11.

When the power source is turned ON again, the potential at the terminal 17 is raised to the operating point of the external circuit 15. Assuming that the resulting potential is $V_{op}$, the potential at the terminal 18 instantaneously rises by $V_{op}$. For the potential at the terminal 18 to restore itself to the regular operation point, it requires a transitional time represented by a time constant which is determined by the capacitance of the capacitor 12 and the resistance of the resistor 14. During this transitional condition, the normal operation of the amplifier 11 is not guaranteed. This is true with the other amplifier circuits as shown in FIGS. 5B to 5D as well.

Figure 1:
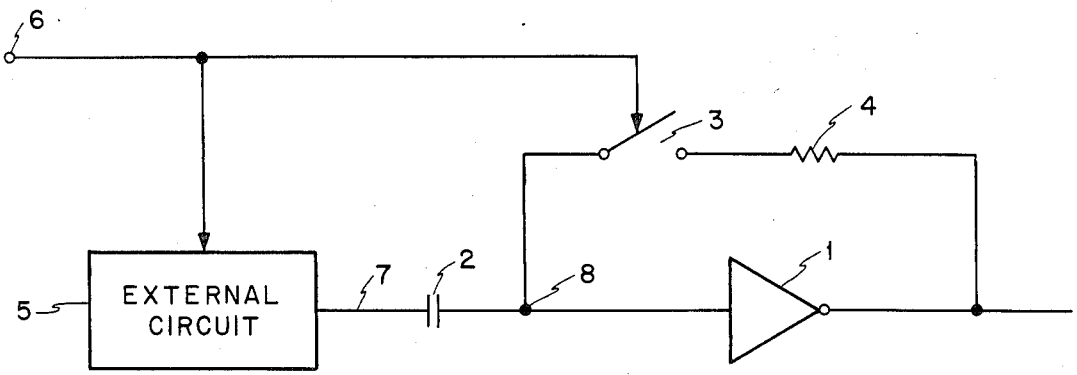
FIGS. 1, 2 and 3 are schematic diagrams showing, respectively, a first, a second and a third embodiments of the present invention.

Referring to FIG. 1, an amplifier circuit in accordance with a first embodiment of the present invention is shown. As shown, an input terminal and an output terminal of an amplifier 1 is connected to each other by a feedback circuit which is comprised of a series connection of a switch 3 and a resistor 4. The switch 3 is connected to a power source control terminal 6 which is associated with an external circuit 5. Switch 3 is turned on and off in a timed relationship with respect to the ONs and OFFs of the power source of the external circuit 5. Specifically, the switch 3 becomes closed when the power source of the external circuit 5 is turned ON and becomes open when the circuit 5 is turned OFF. Hence, when power is fed to the external circuit 5, the switch 3 is closed to complete the feedback loop of the amplifier 1 by the resistor 4 previously mentioned. Concerning the potentials on the terminals 7 and 8 of the capacitor 2, under the closed condition of switch 3, the terminal 7 is set at the operating point of the external circuit 5. The terminal 8 is set at the operating point of the amplifier 1, which is set by the amplifier output fed back via the resistor 4. At this instant, assuming that the potential differential between the terminals 7 and 8 is $V_{7-8}$, the capacitor 2 is charged by a voltage $V_{7-8}$.

When the power source of the external circuit 5 is turned OFF, the terminal 7 becomes a zero potential and, at the same time, the switch 3 becomes open. Under this condition, if the time constant which depends upon the input impedance of the amplifier 1 and the capacitance of the capacitor 2 is sufficiently longer than the duration of an OFF state of the power source, the terminal 8 may safely be regarded as floating. Consequently, the capacitor 2 is prevented from being discharged, that is, the voltage $V_{7-8}$ is maintained across the capacitor 2.

When power is applied again to the external circuit 5, the circuit 5 is enabled and, at the same time, the switch 3 is closed. At this instant, because the potential difference between the terminals of the capacitor 2 is constant, the potential at each terminal of the amplifier 1 is restored to the potential which was developed by the ON state of the power, which source occurred last time. It follows that the amplifier 1 can resume the normal operation immediately with its operating point prevented from becoming offset.

Figure 2:
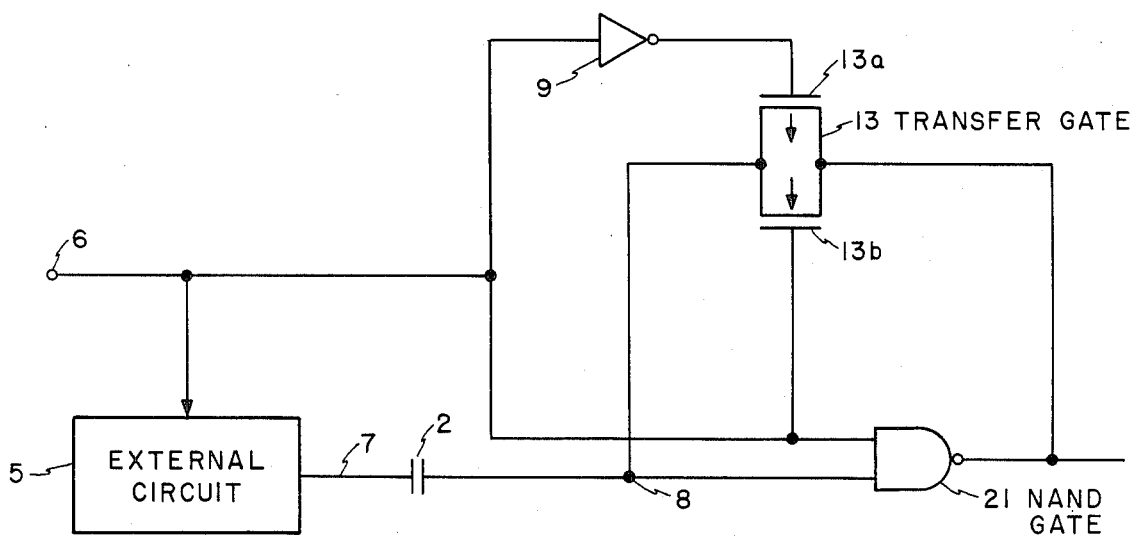

Referring to FIG. 2, an amplifier circuit in accordance with a second embodiment of the present invention is shown. In FIG. 2, the same or similar structural elements as those shown in FIG. 1 are designated by like reference numerals. As shown, the amplifier circuit includes a NAND gate 21 to provide a gating function. A feedback circuit includes a complementary metal-oxide semiconductor (CMOS) transfer gate 13 which plays the two roles of a feedback resistor and of a switch. The power source control terminal 6 is connected to the external circuit 5 and to one input terminal of the NAND gate 21. Further, the terminal 6 is connected via an inverter 9 to the gate of a p-channel MOS field effect transistor (FET) 13a. Terminal 6 is connected directly to the gate of an n-channel MOS FET 13b. The power source associated with the external circuit 5 becomes ON when a control signal applied to the terminal 6 is at a high level and OFF when it is at a low level. The other input terminal 8 and the output of the NAND gate 21 are connected, respectively, to the source and the drain of the transfer gate 13. While a high level control signal is fed to one input terminal of the NAND gate 21 via the terminal 6, the gate 21 functions as a linear amplifier.

With the construction shown and described, the circuit of FIG. 2 operates in the same manner that FIG. 1 operates as an amplifier. When the control signal applied to the terminal 6 is a high level, the NAND gate 21 serves the function of an inverter and linearly amplifies a signal which is applied to the input terminal 8. An inverted version of the control signal (i.e., a low level signal) is applied to the gate of the p-channel MOS FET 13a of the transfer gate 13. A high level control signal is applied directly to the gate of the n-channel MOS FET 13b, whereby the transfer gate 13 is enabled. By suitably selecting the size of the transfer gate 13, it is possible to set up a desired resistance of the transfer gate 13 when the gage 13 is enabled. That is, the function of transfer gate 13 in an enabled state is identical to the function of the resistor 4 (FIG. 1).

When the control signal on the terminal 6 becomes a low level, the transfer gate 13 is disabled. As a result, the terminal 8 is brought into a floating state. Although a high potential appears on the output of the NAND gate 21 due to the low level of the control signal, the output potential of the gate 21 does not affect the potential on the terminal 8 since the transfer gate 13 has been disabled. When the control signal again becomes a high level, the NAND gate 21 resumes its normal operation immediately, as in the case of FIG. 1.

Figure 3:
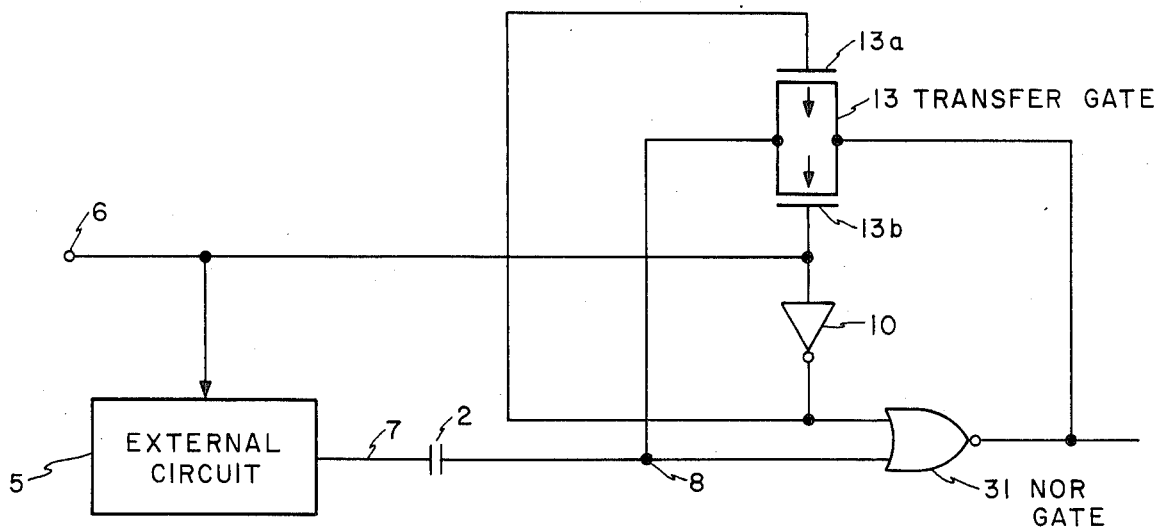

Referring to FIG. 3, a third embodiment of the present invention is shown. Because this embodiment is essentially similar to that of FIG. 2, the same or similar structural elements as those of FIG. 2 are designated by like reference numerals. As shown, an inverter 10 is connected to the gate of the n-channel MOS FET 13b of the transfer gate 13. The amplifier circuit of FIG. 3 operates in the same manner that FIG. 2 operates except that a low potential appears on the output of the NOR gate 31 when the power source is turned OFF, i.e., when the control signal is a low level. The output of the NOR gate 31 does not affect the potential at the input terminal 8, irrespective of whether it is at a low level or a high level in the OFF state of the power source.

Figure 4:
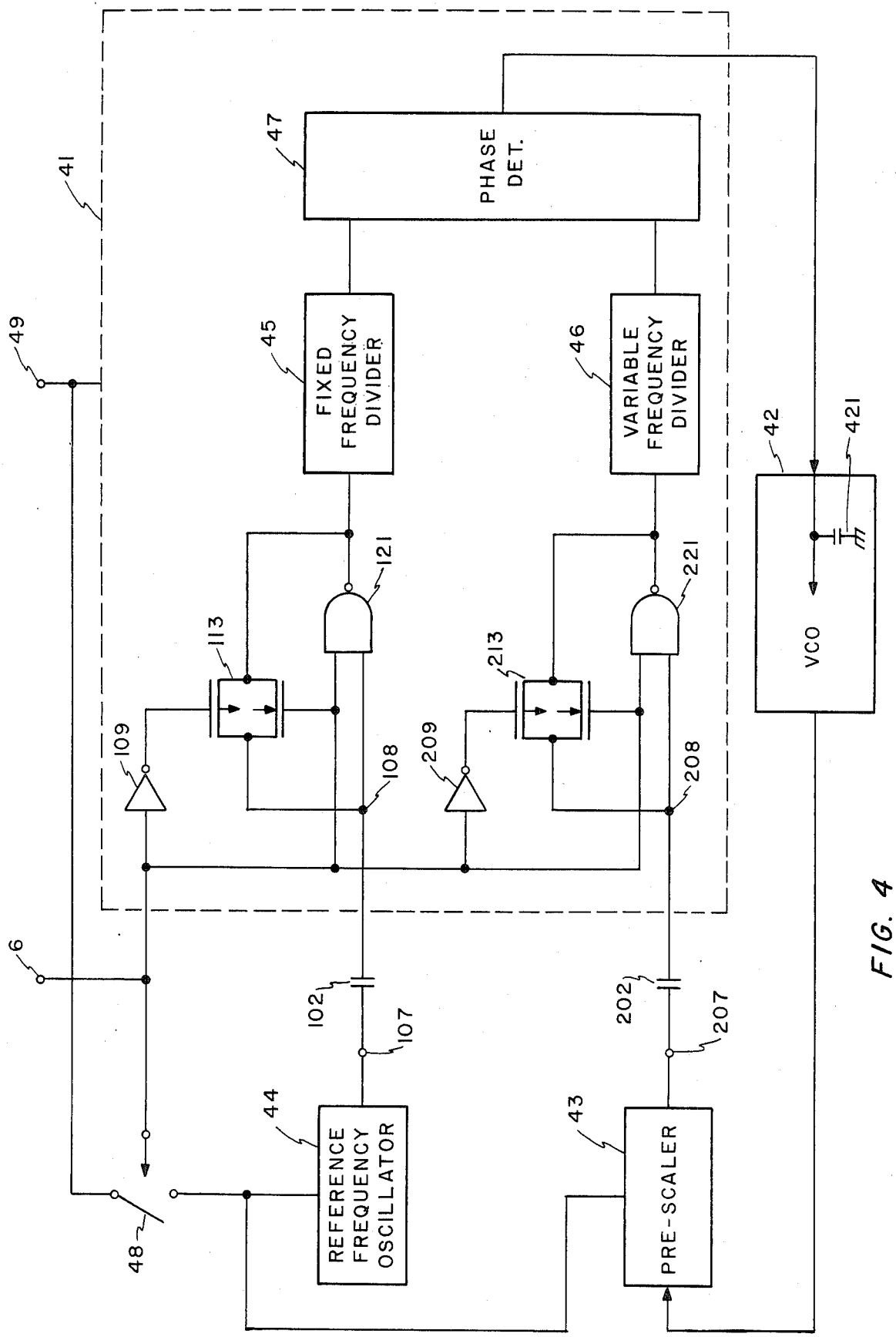
FIG. 4 is a schematic block diagram of a PLL to which the amplifier circuit of FIG. 2 is applied.

Referring to FIG. 4, there is shown a PLL which is operated intermittently for battery saving purpose and which is implemented with the amplifier circuit of FIG. 2. The PLL includes a voltage controlled oscillator (VCO) 42 adapted to generate a signal whose frequency is determined by the output voltage of a phase detector 47. The output frequency of VCO 42 is stepped down by a pre-scaler 43 to a suitable frequency and, then, is routed to a variable frequency divider 46. The output of a reference frequency oscillator 44 is fed to a fixed frequency divider 45. The phase detector 47 phase compares the output of the fixed frequency divider 45 with the output of the variable frequency divider 46 to produce a phase error signal, the phase error signal being applied to the VCO 42 as a control signal. Capacitors 102 and 202 are connected, respectively, between the reference frequency oscillator 44 and the fixed frequency divider 45 and between the pre-scaler 43 and the variable frequency divider 46. Each capacitor adjusts the operating point of its associated circuit, each for the purpose of adjusting the operating point. Connected to each of the capacitors 102 and 202 is the amplifier circuit which is constructed as shown in FIG. 2. The operation of a PLL circuit is well known to those skilled in the art and, therefore, the details thereof will not be described to avoid redundancy.

To enhance battery saving, the reference frequency oscillator 44 and the pre-scaler 43 are operated intermittently. Specifically, a power source coupled to a power source terminal 49 is turned ON and OFF by a power source switch 48 which is responsive to the control signal, which is applied to the control terminal 6. Thus, the frequency oscillator 44 and the pre-scaler 43 are each operated periodically. The control terminal 6 is also coupled to transfer gates 113 and 213 of the two amplifier circuits so that both of the transfer gates 113 and 213 are enabled when the oscillator 44 and pre-scaler 43 are in an ON state and disabled when they are in an OFF state.

In this construction, the reference frequency oscillator 44 and pre-scaler 43 in combination correspond to the external circuit 5 of FIG. 2. Further, terminals 107 and 207 correspond to the terminal 7 of FIG. 2. The capacitors 102 and 202 correspond to the capacitor 2. Inverters 109 and 209 correspond to the inverter 9. The transfer gates 113 and 213 correspond to the transfer gate 13. The NAND gates 121 and 221 correspond to the NAND gate 21.

The two amplifier circuits, fixed frequency divider 45, variable frequency divider 46 and phase comparator 47 are implemented with a CMOS integrated circuit (IC), which is designated by numeral 41. Hence, while an input signal to the amplifier circuits is absent, the current consumed by the CMOS IC 41 is zero, despite the power source being constantly coupled thereto via the terminal 49. Consequently, the battery saving switching timed to and in the same manner as the intermittent operations of the oscillator 44 and pre-scaler 43.

In operation, when the switch 48 is closed, the oscillator 44, pre-scaler 43 and CMOS IC 41 are turned ON so that the PLL is operated in a usual manner. When the switch 48 is opened to cut off the power supply to the oscillator 44 and pre-scaler 43, the potential appearing at each of the output terminals 107 and 207 becomes zero. However, because the transfer gates 113 an 213 are disabled at that time, the terminals 108 and 208 become open, with respect to DC, to prevent the potentials stored on resulting in the potentials the capacitors 102 and 202 from being discharged. Hence, when the switch 48 is closed again, the power source of the oscillator 44 and pre-scaler 43 is turned ON while, at the same time, the transfer gates 113 and 213 are enabled. As a result, the potentials on the input terminals 108 and 208 are instantly restored to their adequate values. This eliminates the delay of the enabling due to transitional responses which are caused by the capacitors 102 and 202 adapted for the adjustment of operating point. The VCO 42 is provided with a capacitor 421 at its input so that a charge stored in the capacitor 421 may allow the VCO 42 to operate normally even when the power source is cut off.

In summary, it will be seen that the present invention provides an amplifier circuit which can resume a normal operation immediately after a power source has been switched from an off state to an to state. This unprecedented advantage is derived from a unique arrangement wherein a feedback circuit associated with an amplifier comprises a series connection of a switch and a resistor. The switch is interlocked with a power source of an external circuit, which is connected to an input of the amplifier via a capacitor. Thus, the potential difference between both ends of the capacitor is maintained constant with no regard to the ON/OFF state of the external circuit.

Because the amplifier circuit of the present invention may be readily implemented with a transfer gate which serves both as a resistor and a switch, it is feasible for large-scale integration.

In another embodiment of the present invention, a use may be made of an FET amplifier. Further, any other suitable element may be used as an amplifier insofar as the time constant which is determined by the amplifier DC resistance and serial capacitance in the open condition of the switch is sufficiently greater than the period of intermittent operation and is not critical from the system standpoint.

What is claimed is:

1. An amplifier circuit comprising:
capacitor means connected at one end thereof to an output of an external circuit;
amplifier means having an input connected to another end of said capacitor means;
resistor means connected between the input and an output of said amplifier means; and
switch means connected in series with said resistor means and being closed when said external circuit operates and opened when said external circuit does not operate, the operation and non-operation of said external circuit being controlled by applications of power from a power source to said external circuit.

2. An amplifier circuit comprising:
capacitor means connected at one end thereof to an output of an external circuit;
amplifier means connected at an input thereof to the other end of said capacitor means;
resistor means connected between the input and an output of said amplifier means; and
switch means connected in series with said resistor means and being closed when said external circuit operates and opened when said external circuit does not operate,
the operation and non-operation of said external circuit being controlled by applications of power from a power source to said external circuit,
said amplifier means comprising a NAND gate having two inputs one of which is connected to the other end of said capacitor, and said resistor means and said switch means comprising a CMOS transfer gate having a source and a drain which are connected between the output and the other of said two inputs of said NAND gate; an inverter having an output which is connected to a gate of a p-channel MOS FET of said CMOS transfer gate; and connecting means for applying a signal to control a switching ON/OFF of said power source to the input of said inverter, to the other input of said NAND gate, and to the gate of an n-channel MOS FET of said NAND gate.

3. An amplifier circuit comprising:
capacitor means connected at one end thereof to an output of an external circuit;
amplifier means connected at an input thereof to the other end of said capacitor means;
resistor means connected between the input and an output of said amplifier means; and
switch means connected in series with said resistor means and being closed when said external circuit operates and opened when said external circuit does not operate,
the operation and non-operation of said external circuit are controlled by applications of power from a power source to said external circuit,
said amplifier means comprising a NOR gate having two inputs one of which is connected to the other end of said capacitor, said resistor means and said switch means comprising a CMOS transfer gate having a source and a drain which are connected between the output and the one of said two inputs of said NOR gate; an inverter connected at the input thereof to the gate of an n-channel MOS FET of said CMOS transfer gate; first connecting means for applying a signal to control an ON/OFF switching of said power source to the gate of said n-channel MOS FET, and to said input of said inverter; and second connecting means for connecting an output of said inverter to the gate of a p-channel MOS FET of said CMOS transfer gate and to the other input of said NOR gate.

4. An amplifier circuit for use in an intermittently operated phase locked loop comprising a voltage controlled oscillator for producing a signal having an oscillation frequency which corresponds to a control signal; a pre-scaler for stepping down an output of said voltage controlled oscillator to a predetermined frequency; a reference frequency oscillator for producing a signal having a reference frequency; and a phase detector for comparing the output phase of said pre-scaler with the phase of said reference frequency oscillator and for providing the result of the resulting comparison to said voltage controlled oscillator as said control signal, said amplifier circuit comprising:
first and second capacitors connected, respectively, between said reference frequency oscillator and said phase detector and between said pre-scaler and said phase detector;
first and second amplifier means connected, respectively, between said first capacitor and said phase detector and between said second capacitor and said phase detector; and
first and second feedback means being connected to said first and second amplifier means, respectively, when said reference frequency oscillator and said pre-scaler operate, and being disconnected from said first and second amplifier, respectively when said reference frequency oscillator and said pre-scaler do not operate, said first and second feedback means feeding back outputs of said first and second amplifier means to inputs thereof, respectively, when they are connected to the associated amplifier means.

5. An amplifier circuit as claimed in claim 4, wherein said phase locked loop further comprises a fixed frequency divider and a variable frequency divider connected, respectively, between said first amplifier means and said phase detector and between said first amplifier means and said phase detector, and wherein said first and second amplifier means, said fixed and variable frequency dividers and said phase detector are constituted by a MOS integrated circuit.

6. An amplifier circuit as claimed in claim 5, wherein said first and second feedback circuits comprise first and second resistor means, respectively.

7. An amplifier circuit for use in an intermittently operated phase locked loop comprising a voltage controlled oscillator for producing a signal having an oscillation frequency which corresponds to a control signal; a pre-scaler for stepping down an output of said voltage controlled oscillator to a predetermined frequency; a reference frequency oscillator for producing a signal having a reference frequency; and a phase detector for comparing the output phase of said pre-scaler with the phase of said reference frequency oscillator and for providing the result of the resulting comparison to said voltage controlled oscillator as said control signal, said amplifier circuit comprising:
first and second capacitors connected, respectively, between said reference frequency oscillator and said phase detector and between said pre-scaler and said phase detector;
first and second amplifier means connected, respectively, between said first capacitor and said phase detector and between said second capacitor and said phase detector; and
first and second feedback means being connected to said first and second amplifier means, respectively, when said reference frequency oscillator and said pre-scaler operate, and being disconnected from said first and second amplifier, respectively, when said reference frequency oscillator and said pre-scaler do not operate, said first and second feedback means feeding back outputs of said first and second amplifier means to inputs thereof, respectively, when they are connected to the associated amplifier means,
said first and second amplifier means comprising first and second two-input NAND gates, respectively, said NAND gates being connected at one of said two inputs thereof to said first and second capacitors, respectively;
said first and second feedback means comprising first and second CMOS transfer gates, respectively.

8. An amplifier circuit comprising:
amplifier means having an input which is connected to an external circuit via a capacitor; and
feedback means being connected to said amplifier means when said external circuit operates, and being disconnected from said amplifier when said external circuit does not operate, said feedback means feeding back an output of said amplifier means to an input thereof when said feedback means is connected to said amplifier means, the operation and non-operation of said external circuit being controlled by applications of power from a power source to said external circuit.

9. An amplifier circuit as claimed in claim 8, wherein said amplifier means comprises an inverting amplifier, said feedback means comprising a resistor.

10. An amplifier circuit comprising:
amplifier means having an input which is connected to an external circuit via a capacitor; and
feedback means being connected to said amplifier means when said external circuit operates, and being disconnected from said amplifier when said external circuit does not operate, said feedback means feeding back an output of said amplifier means to an input thereof when said feedback means is connected to said amplifier means,
the operation and non-operation of said external circuit being controlled by power application from a power source to said external circuit,
said amplifier means comprising a NAND gate having two inputs one of which is connected to said capacitor;
said feedback means comprising a CMOS transfer gate connected between said one input and an output of said NAND gate, and means for applying a signal to control an ON/OFF switching of said power source, said signal being applied through an inverter to one of two gates of said CMOS transfer gate and directly to the other of said two gates of said CMOS transfer gates and to the other input of said NAND gate.

11. An amplifier circuit comprising:
amplifier means having an input which is connected to an external circuit via a capacitor; and
feedback means being connected to said amplifier means when said external circuit operates, and being disconnected from said amplifier when said external circuit does not operate, said feedback means feeding back an output of said amplifier means to an input thereof when said feedback means is connected to said amplifier means, the operation and non-operation of said external circuit being controlled by applications of power from a power source to said external circuit, said amplifier means comprising a NOR gate having two inputs one of which is connected to said capacitor;

said feedback means and comprising a CMOS transfer gate connected between said one input and an output of said NOR gate, and means for applying a signal adapted to control an ON/OFF switching of said power source, said signal being applied directly to said one gate of said transfer gate and through an inverter to the other gate of said transfer gate and to the other input of said NOR gate.

12. A method of controlling a DC operating point of an amplifier, comprising the steps of:

connecting a capacitor between an output of an external circuit and an input of said amplifier;

connecting a feedback circuit to said amplifier when power is applied to said external circuit, said feedback circuit feeding back an output of said amplifier to the input of said amplifier; and disconnecting said feedback circuit from said amplifier when power is not applied to said external circuit.

13. An amplifier circuit as claimed in claim 4, wherein the operation and non-operation of said reference frequency oscillator and said pre-scaler are controlled by power application from a power source to said reference frequency oscillator and said pre-scaler.

* * * * *